(12) United States Patent
Matsuura et al.

(10) Patent No.: US 8,574,735 B2
(45) Date of Patent: Nov. 5, 2013

(54) BATTERY PACK

(75) Inventors: Shinichi Matsuura, Hyogo (JP);
Atsushi Kawasumi, Hyogo (JP); Toru Nishikawa, Hyogo (JP); Kenichi Kobayashi, Hyogo (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 13/611,115

(22) Filed: Sep. 12, 2012

(65) Prior Publication Data

US 2013/0002261 A1     Jan. 3, 2013

Related U.S. Application Data

(62) Division of application No. 12/314,482, filed on Dec. 11, 2008, now abandoned.

(30) Foreign Application Priority Data

Dec. 12, 2007   (JP) ................. 2007-321375

(51) Int. Cl.
*H01M 10/48*   (2006.01)

(52) U.S. Cl.
USPC .......................................... 429/90

(58) Field of Classification Search
USPC ........................................... 429/90
See application file for complete search history.

(56) References Cited

U.S. PATENT DOCUMENTS

| | | | |
|---|---|---|---|
| 2004/0010725 A1* | 1/2004 | Chan | 713/300 |
| 2005/0285566 A1* | 12/2005 | Furukawa et al. | 320/116 |
| 2006/0139010 A1* | 6/2006 | Wang et al. | 320/136 |
| 2006/0152194 A1 | 7/2006 | Wang et al. | |
| 2008/0007204 A1* | 1/2008 | Yano | 320/104 |
| 2008/0012531 A1 | 1/2008 | Chang et al. | |

FOREIGN PATENT DOCUMENTS

| | | |
|---|---|---|
| JP | 10-014122 | 1/1998 |
| JP | 2003-304646 | 10/2003 |
| JP | 2004-127663 | 4/2004 |
| JP | 2004-282798 | 10/2004 |

* cited by examiner

*Primary Examiner* — Patrick Ryan
*Assistant Examiner* — Muhammad Siddiquee
(74) *Attorney, Agent, or Firm* — Wenderoth, Lind & Ponack, L.L.P.

(57) ABSTRACT

The battery pack is provided with an analog front-end that detects battery voltage, and a micro-controller connected to the analog front-end that accepts analog voltage signals from the analog front-end as input. The micro-controller switches voltage signals input from the analog front-end to determine failure of the analog front-end or the micro-controller.

5 Claims, 2 Drawing Sheets

BATTERY PACK

This application is a divisional of application Ser. No. 12/314,482, filed Dec. 11, 2008 now abandoned.

BACKGROUND OF THE INVENTION

1. Field of the Invention

The present invention relates to a battery pack that can determine failure while keeping circuit structure simple without providing a complex circuit for the purpose of determining failure.

2. Description of the Related Art

In a battery pack housing batteries, safety can be improved by controlling current with battery voltage. In particular, for a battery pack with lithium ion batteries, a level of safety is attained by controlling voltages below a set voltage. A battery pack implementing this technique houses a protection circuit that detects battery voltage and controls current based on the detected voltage. Since this type of battery pack can be safely used if the protection circuit operates properly, it has the drawback that it cannot be safely used if the protection circuit fails to operate properly. To prevent this drawback, circuits to determine if the protection circuit operates properly have been disclosed. Circuits to determine battery protection circuit failure are cited in Japanese Patent Application Disclosures 2003-304646, 2004-127663, and 2004-282798.

SUMMARY OF THE INVENTION

As described in these patent references, a dedicated circuit is provided to determine protection circuit failure and allow judgment of various types of failure. However, since a special circuit to determine failure is provided, circuit structure becomes complex. In particular, the failure judging circuit is used only to determine failure of the battery protection circuit and is not a necessary element of the protection circuit. Therefore, provision of a circuit dedicated to determining failure of the protection circuit is extremely uneconomic.

The present invention was developed to resolve these drawbacks Thus, it is a primary object of the present invention to provide a battery pack that improves safety by determining failure while using an extremely simple circuit structure that does not provide a dedicated circuit to judge failure.

The battery pack of the present invention is provided with the following structure to achieve the object described above. The battery pack is provided with an analog front-end 2 to detect voltage of the batteries 1, and with a micro-controller 3 connected to the analog front-end 2 to accept input of analog voltage signals from the analog front-end 2. The battery pack controls the analog front-end 2 with the micro-controller 3 to determine failure of the analog front-end 2 or the micro-controller 3.

The battery pack of the present invention described above has the characteristic that safety can be improved by determining failure with an extremely simple circuit structure and without providing a dedicated circuit to determine failure. In particular, since the micro-controller can control the analog front-end to determine failure without changing the circuit structure of the battery pack, various circuit failures can be determined without changing hardware through software changes only.

In particular, the battery pack described above is provided with a plurality of series connected batteries. The analog front-end is provided with input switches controlled by the micro-controller, and with a battery voltage detection circuit that connects with the plurality of batteries via the input switches. The micro-controller can switch the input switches to measure the voltage of each battery and the total voltage of all the series connected batteries. The micro-controller can compare the sum of the voltages of each individual battery with the total measured voltage to determine voltage detection circuit failure.

Further, the battery pack described above is provided with a plurality of series connected batteries. The analog front-end is provided with input switches controlled by the micro-controller, and with a battery voltage detection circuit that connects with the plurality of batteries via the input switches. The micro-controller can switch the input switches to short circuit the input-side of the voltage detection circuit to determine input switch failure. This battery pack can control input switches via the micro-controller, and determine input switch failure from the output voltage of the voltage detection circuit.

Still further, the analog front-end of the battery pack described above is provided with input switches controlled by the micro-controller, and with a battery voltage detection circuit that connects with batteries via the input switches. This voltage detection circuit is provided with a difference amplifier to detect battery voltage, and this difference amplifier has a standard voltage input to one of its input terminals. The micro-controller can control the input switches to input battery voltage to the difference amplifier in a reversed polarity state, and in an un-reversed polarity state, and voltage detection circuit failure can be determined from the output voltages. This battery pack can control the input switches to reverse the polarity of the voltage signal input to the difference amplifier to determine failure.

Finally, the micro-controller of the battery pack described above is provided with an analog-to-digital (ND) converter to convert analog voltage signals input to the micro-controller to digital signals, and with a first reference voltage circuit to input a first reference voltage to the A/D converter. The analog front-end is provided with a second reference voltage circuit to output a second reference voltage, which is a different voltage than the first reference voltage, to the micro-controller. The micro-controller can switch between the first reference voltage and the second reference voltage to determine failure of the first reference voltage (VC1), the second reference voltage (VC2), or the ND converter. This battery pack can determine first reference voltage (VC1), second reference voltage (VC2), or A/D converter failure while using a simple circuit structure.

The above and further objects of the present invention as well as the features thereof will become more apparent from the following detailed description to be made in conjunction with the accompanying drawings.

DESCRIPTION OF THE PREFERRED EMBODIMENTS

Figure 1:
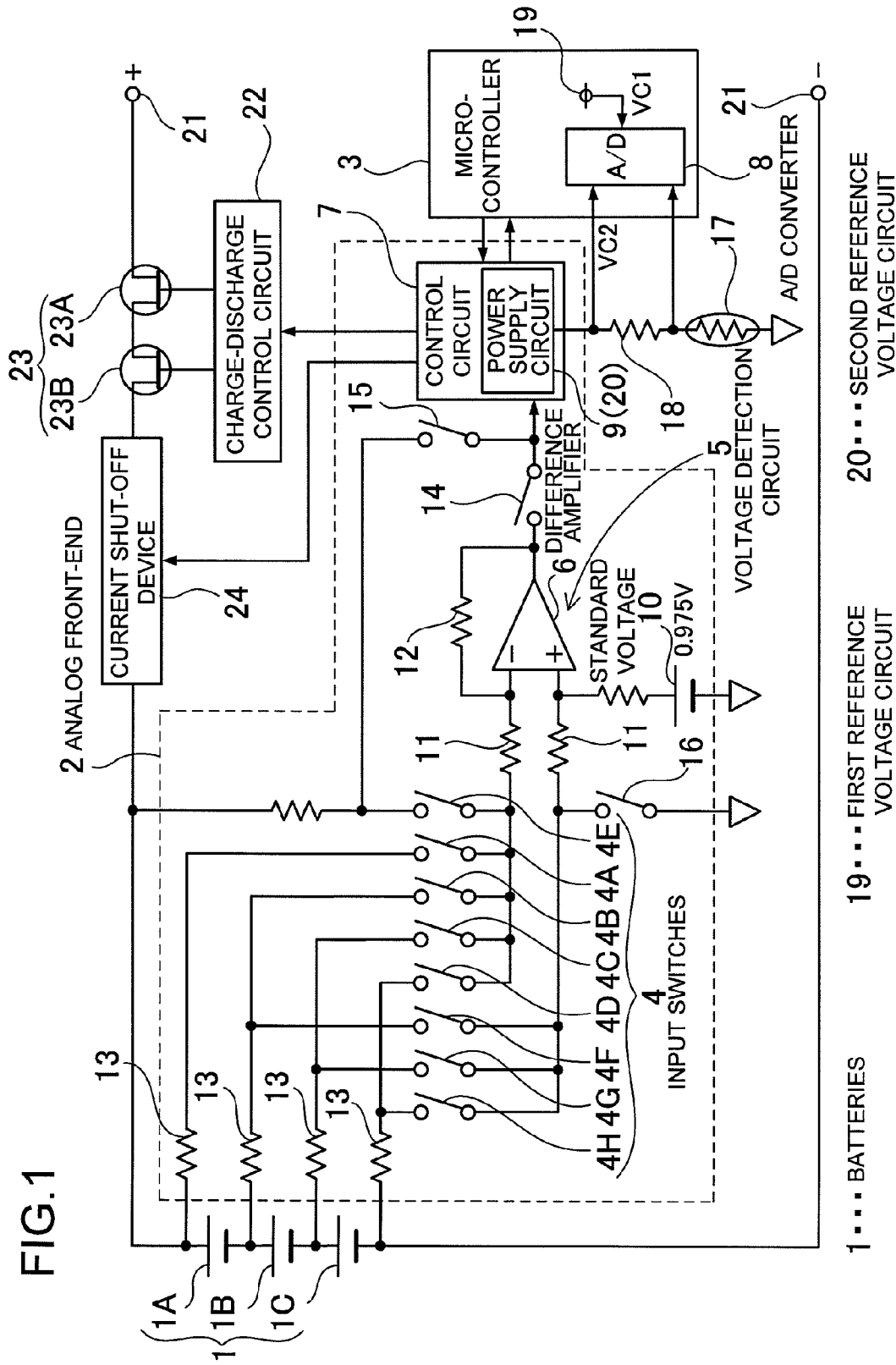
FIG. 1 is a circuit diagram of a one embodiment of the battery pack of the present invention.

The battery pack is provided with a plurality of series connected batteries 1. An analog front-end 2 is provided with input switches 4 controlled by a micro-controller 3, and with a battery 1 voltage detection circuit 5 that connects with the plurality of batteries 1 via the input switches 4. In this battery pack, the micro-controller 3 switches the input switches 4 to measure the voltage of each battery 1 and the total voltage of all the series connected batteries 1 to determine voltage detection circuit 5 failure.

A battery pack of another embodiment is provided with a plurality of series connected batteries 1. An analog front-end 2 is provided with input switches 4 controlled by a micro-controller 3, and with a battery 1 voltage detection circuit 5 that connects with the plurality of batteries 1 via the input switches 4. In this battery pack, the micro-controller 3 switches the input switches 4 to short circuit the input-side of the voltage detection circuit 5 to determine input switch 4 failure.

In a battery pack of still another embodiment, an analog front-end 2 is provided with input switches 4 controlled by a micro-controller 3, and with a battery 1 voltage detection circuit 5 that connects with batteries 1 via the input switches 4. This voltage detection circuit 5 is provided with a difference amplifier 6 to detect battery 1 voltage. This difference amplifier 6 has a standard voltage 10 input to one of its input terminals. In this battery pack, the micro-controller 3 controls the input switches 4 to input battery 1 voltage to the difference amplifier 6 in a reversed polarity state, and in an un-reversed polarity state to determine voltage detection circuit 5 failure from the output voltages.

In a battery pack of still another embodiment, a micro-controller 3 is provided with an ND converter 8 to convert input analog voltage signals to digital signals, and with a first reference voltage circuit 19 to input a first reference voltage (VC1) to the ND converter 8. An analog front-end 2 is provided with a second reference voltage circuit 20 to output a second reference voltage (VC2), which is a different voltage than the first reference voltage (VC1), to the micro-controller 3. In this battery pack, the micro-controller 3 switches between the first reference voltage (VC1) and the second reference voltage (VC2) to determine failure of the first reference voltage (VC1), the second reference voltage (VC2), or the A/D converter 8.

The battery pack shown in the circuit diagram of FIG. 1 is provided with a plurality of series connected batteries 1, an analog front-end 2 that detects the voltage of each battery 1, and a micro-controller 3 connected to the analog front-end 2 to accept input of analog voltage signals from the analog front-end 2.

The batteries 1 are lithium ion rechargeable batteries. However, the battery pack of the present invention is not limited specifically to lithium ion batteries. The batteries can be any rechargeable batteries for which battery voltage can be detected and charging and discharging current can be controlled, such as nickel hydride batteries or nickel cadmium batteries.

The battery pack of the figure has three batteries 1, which are a first, second, and third battery, connected in series. However, the battery pack of the present invention does not specify the number of batteries. Although, in a battery pack with a plurality of series connected batteries, voltage detection circuit 5 failure can be determined from the total battery voltage.

The analog front-end 2 is provided with input switches 4 that are controlled ON and OFF by the micro-controller 3, and with a battery 1 voltage detection circuit 5 that connects with the plurality of batteries 1 via the input switches 4. In addition, the analog front-end 2 of the figure is provided with a power supply circuit 9 to convert battery 1 voltage to a reference voltage (for example, 2.5V) for output to the micro-controller 3 A/D converter 8.

The voltage detection circuit 5 is provided with a difference amplifier 6 to detect the voltage of each battery 1. Input switches 4 are switched to connect each battery 1 to the inverting and non-inverting input terminals of the difference amplifier 6 and detect the voltage of each battery 1. In the difference amplifier 6 of the figure, a standard voltage 10 (0.975V in the figure) is input to one input terminal, which is the non-inverting input terminal in the figure. Further, inverting and non-inverting input terminals of the difference amplifier 6 are connected to positive and negative battery 1 electrodes via the input switches 4. In addition, the difference amplifier 6 of the figure has input resistors 11 connected to its input terminals, and these input resistors 11 are connected in series with the input switches 4. The difference amplifier 5 also has a feedback resistor 12 connected between the inverting input terminal and the output terminal to set the gain to an optimum value. The difference amplifier 6 output-side is connected to the micro-controller 3 and it outputs the detected voltage of a battery 1 as an analog voltage signal.

Input switches 4 are connected between difference amplifier 6 input terminals and positive and negative battery 1 electrodes. Each input switch 4 is connected to each battery 1 through a series resistor 13. In the battery pack of the figure, five input switches 4 are connected in parallel with the inverting input terminal of the difference amplifier 6. The five input switches 4 are made up of the first through fifth input switches 4. The first input switch 4A is connected to the positive-side of the first battery 1A, which is the positive-side of the battery pack; the second input switch 4B is connected to the connection node between the first battery 1A and the second battery 1B; the third input switch 4C is connected to the connection node between the second battery 1B and the third battery 1C; and the fourth input switch 4D is connected to the negative-side of the third battery 1C. In addition, the fifth input switch 4E is connected to the positive-side of the first battery 1A. The non-inverting-side of the difference amplifier 6 is connected to each battery 1 via three input switches 4. The three input switches 4 are made up of the sixth through eighth input switches 4. The sixth input switch 4F is connected to the connection node between the first battery 1A and the second battery 1B; the seventh input switch 4G is connected to the connection node between the second battery 1B and the third battery 1C; and the eighth input switch 4H is connected to the negative-side of the third battery 1C.

The analog front-end 2 of the figure has an output switch 14 connected in series with the output-side of the difference amplifier 6. The output switch 14 cuts-off difference amplifier 6 output when it is switched to the OFF state. In addition, a total voltage detection switch 15 is connected at the output-side of the output switch 14. The total voltage detection switch 15 connects the output-side of the output switch 14 to the positive-side of the first battery 1A. The output switch 14 is controlled by the micro-controller 3. The output switch 14 is switched ON to attain output from the difference amplifier 6, and it is switched OFF to cut-off output from the difference amplifier 6. With the output switch 14 OFF to cut-off difference amplifier 6 output, and the total voltage detection switch 15 switched ON, the analog front-end 2 outputs the total voltage of the series connected batteries 1. The total voltage output is input to the micro-controller 3 via the control circuit 7, and the micro-controller 3 thereby detects the total voltage of the series connected batteries 1.

The voltage of each battery 1 is detected by switching the first through eighth input switches 4. The first through eighth input switches 4 are controlled ON and OFF by the micro-controller 3. The micro-controller 3 controls the input switches 4 in the following manner to detect the voltages of the first, second, and third batteries 1 with the voltage detection circuit 5. In this case, the output switch 14 is controlled ON and the total voltage detection switch 15 is controlled OFF to route difference amplifier 6 output to the control circuit 7. The control circuit 7 outputs the input analog signal to the micro-controller 3. The micro-controller 3 converts the input analog voltage signal to a digital signal with the A/D converter, and detects battery 1 voltage as a digital signal.

The first input switch 4A and the sixth input switch 4F are turned ON while all other input switches 4 are OFF . . . . The voltage of the first battery 1A is detected.

The second input switch 4B and the seventh input switch 4G are turned ON while all other input switches 4 are OFF . . . . The voltage of the second battery 1B is detected.

The third input switch 4C and the eighth input switch 4H are turned ON while all other input switches 4 are OFF . . . . The voltage of the third battery 1C is detected.

The micro-controller 3 can switch the input switches 4 in the manner described above to detect the voltages of the first, second, and third batteries 1. In addition, the micro-controller 3 can switch the output switch 14 OFF and the total voltage detection switch 15 ON to detect the total voltage of the series connected batteries 1. If the voltage detection circuit 5 is operating properly, the total voltage will be equal to the sum of the voltages of the first, second, and third batteries 1. Consequently, the micro-controller 2 determines voltage detection circuit 5 failure by determining if total voltage is equal to the sum of the voltages of the first, second, and third batteries 1.

Further, the micro-controller 3 turns input switches 4 ON in the following combinations to short circuit the input-side of the difference amplifier 6, which makes up the voltage detection circuit 5, to determine input switch 4 failure.

The second input switch 4B and the sixth input switch 4F are turned ON while all other input switches 4 are OFF.

The third input switch 4C and the seventh input switch 4G are turned ON while all other input switches 4 are OFF.

The fourth input switch 4D and the eighth input switch 4H are turned ON while all other input switches 4 are OFF.

When input switches 4 are switched ON and OFF in the combinations described above to short circuit the input-side of the difference amplifier 6, input voltage becomes 0V. Consequently, the micro-controller 3 can control the input switches 4 in the manner described above and determine input switch 4 failure when difference amplifier 6 input voltage does not become 0V. To determine input switch 4 failure, the micro-controller 3 detects difference amplifier 6 input voltage from its output voltage.

Figure 2:
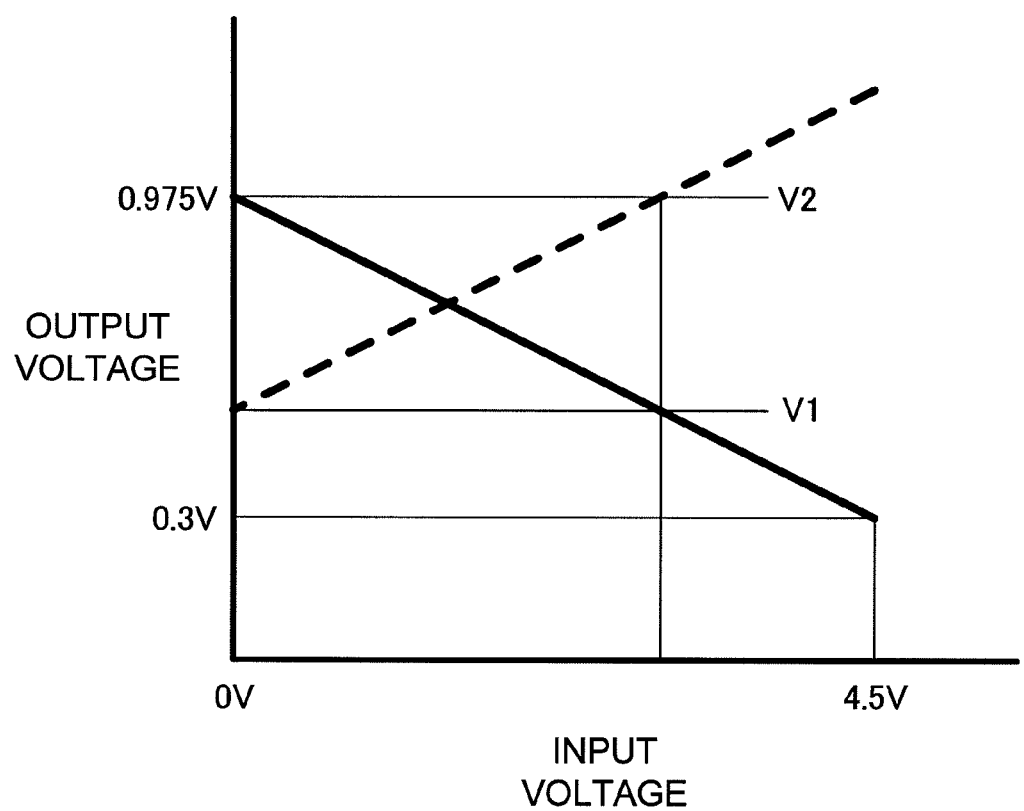
FIG. 2 is a graph showing the input-output characteristics of the difference amplifier.

FIG. 2 shows the input-output characteristics of the difference amplifier 6. This difference amplifier 6 has an output of 0.975V when its input is 0V. Therefore, when the input-side of the difference amplifier 6 is short circuited, the micro-controller 3 determines failure by whether the output is 0.975V or not. Input switches 4 are judged not failing when difference amplifier 6 output is 0.975V.

Further, the micro-controller 3 switches the input switches 4 to input battery 1 voltage to the difference amplifier 6 in reversed and un-reversed polarity to determine voltage detection circuit 5 failure from its output. For the difference amplifier 6 with the input-output characteristics shown in FIG. 2, a 0V input results in a 0.975V output, and a 4.5V input results in a 0.3V output. This difference amplifier 6 has gain of 0.15, and output voltage is shifted positive by 0.975V. In this difference amplifier 6, input polarity can be switched for reversed and un-reversed polarity to determine failure from the output. For reversed input polarity, the 0.975V standard voltage for input level shifting can be changed to obtain the input-output characteristics shown by the broken line of FIG. 2. As shown in FIG. 1, a switch 16 connected between the non-inverting input terminal of the difference amplifier 6 and ground can be turned ON to adjust input voltage level shifting.

Battery 1 voltage is input to this difference amplifier 6 in the reversed polarity state and in the un-reversed polarity state to change the output voltage. For example, for battery 1 voltage located on the graph of FIG. 2, output voltage is V1 on the solid line in the un-reversed polarity state, and output voltage is V2 on the broken line in the reversed polarity state. Consequently, the micro-controller 3 can switch input switches 4 to input voltage to the difference amplifier 6 in the reversed polarity state and in the un-reversed polarity state and determine voltage detection circuit 5 failure by whether the voltages V1 and V2 are output. The micro-controller 3 switches the input switches 4, judges proper operation if the output voltages are V1 and V2, and judges failure for deviation from those voltages.

The micro-controller 3 controls input switches 4 in the following manner to input battery 1 voltage to the difference amplifier 6 in the reversed polarity state and in the un-reversed polarity state. When voltage of the second battery 1B is input in the un-reversed polarity state, the micro-controller 3 controls the second input switch 4B and the seventh input switch 4G ON and all other input switches 4 OFF. When voltage of the second battery 1B is input in the reversed polarity state, the micro-controller 3 controls the third input switch 4C and the sixth input switch 4F ON and all other input switches 4 OFF. Further, when voltage of the third battery 1C is input in the un-reversed polarity state, the micro-controller 3 controls the third input switch 4C and the eighth input switch 4H ON and all other input switches 4 OFF. When voltage of the third battery 1C is input in the reversed polarity state, the micro-controller 3 controls the fourth input switch 4D and the seventh input switch 4G ON and all other input switches 4 OFF.

Further, the reference voltage of the ND converter 8, which converts input analog voltage signals to digital signals, can be switched to determine failure of the reference voltage or the ND converter 8. To enable analog-to-digital conversion by the internal ND converter 8, the micro-controller 3 is provided with a first reference voltage circuit 19 to input a first reference voltage (VC1) to the A/D converter 8. The micro-controller 3 has a circuit structure that also allows input of an external reference voltage for analog-to-digital conversion. The micro-controller 3 can input an external second reference voltage (VC2) to enable analog-to-digital conversion. Even if input voltage is the same, the digital signal output from the A/D converter 8 will change depending on the reference voltage used for conversion. The ratio of change in the output digital signal is determined by the reference voltages used for conversion. Consequently, if analog-to-digital conversion is performed on the same input voltage using both the internal first reference voltage (VC1) and the externally input second reference voltage (VC2), failure of the first reference voltage (VC1), the second reference voltage (VC2), or the ND converter can be determined from the value of the digital output voltage for each reference voltage. This is because if reference voltage fails by shifting value or the ND converter 8 fails to convert properly, digital voltage values obtained by conversion with the first reference voltage (VC1) and with the second reference voltage (VC2) will not be in a specific ratio.

To test for reference voltage or ND converter 8 failure, voltage from a temperature sensor 17 is used as the voltage signal input to the ND converter 8. The temperature sensor 17 is a device that changes electrical resistance with temperature such as a thermistor. The temperature sensor 17 of FIG. 1 is connected in series with a voltage divider resistor 18. The series connection of the voltage divider resistor 18 and the temperature sensor 17 is connected between the power supply circuit 9 and ground. Voltage at the connection node between the voltage divider resistor 18 and the temperature sensor 17 is input as the temperature signal. Since connection node voltage varies with temperature sensor 17 resistance, temperature sensor 17 resistance can be detected from connection node voltage, and temperature can be detected from temperature sensor 17 resistance. Unlike battery 1 voltage, the temperature signal is connected to the micro-controller 3 without being routed via input switches 4. Therefore, a micro-controller 3 that performs ND conversion of the temperature signal with both the first reference voltage (VC1) and the second reference voltage (VC2) to determine reference voltage or ND converter 8 failure can judge failure without controlling the input switches 4.

For example, the second reference voltage VC2 is 2.5V during proper operation, and voltage at the connection node between the temperature sensor 17 and the voltage divider resistor 18 is converted to a digital value of A/D2 using VC2. At essentially the same time, with the first reference voltage VC1 equal to 1.225V, the converted digital value of the connection node voltage is A/D1 using VC1. The temperature sensor 17 and voltage divider resistor 18 connection node voltage (C[V]) is input at a given temperature. When the first reference voltage (VC1) is used, voltage C=(a constant coefficient)×(VC1)×(A/D1)/$2^{15}$. Similarly, when the second reference voltage (VC2) is used, voltage C=(a constant coefficient)×(VC2)×(A/D2)/$2^{15}$. As a result of measurement of the same connection node voltage (C[V]) at the same temperature, the ratio (A/D1)/(A/D2) is a constant. In fact, for proper operation, the ratio (A/D1)/(A/D2) is the same constant for various temperatures. The micro-controller 3 determines if that ratio is within a specified range to determine reference voltage or A/D converter 8 failure. Specifically, if the ratio is within the specified range, there is no failure; and if it is outside the specified range, there is a failure. When this type of failure was judged for the present embodiment, occurrence of ND converter 8 failure was relatively low, occurrence of micro-controller 3 internal first reference voltage (VC1) failure was relatively low, and occurrence of second reference voltage (VC2) failure was relatively high. For normal temperature measurement, the second reference voltage (VC2) is used.

It should be mentioned that the micro-controller can use another voltage besides the temperature signal to determine reference voltage or A/D converter failure. Any voltage that does not change during the analog-to digital conversion interval using the first reference voltage (VC1) and the second reference voltage (VC2) can also be used to determine reference voltage or A/D converter failure.

The analog front-end 2 of FIG. 1 houses a power supply circuit 9 that supplies power to the series connected voltage divider resistor 18 and temperature sensor 17. This power supply circuit 9 uses voltage from the batteries 1 to output a regulated voltage, for example, 2.5V. In addition, this power supply circuit 9 is connected to the micro-controller 3. Consequently, the micro-controller 3 can use output from this power supply circuit 9 as the second reference voltage (VC2). Specifically, the micro-controller 3 can use this power supply circuit 9 as the second reference voltage circuit 20 for analog-to-digital conversion of input voltages.

The battery pack above is provided with a charge-discharge control circuit 22 to control charging and discharging of the batteries 1. The charge-discharge control circuit 22 controls switching devices 23 to control battery 1 charging and discharging according to the remaining capacity of the batteries 1 input from a remaining capacity computation circuit (not illustrated). The remaining capacity computation circuit computes remaining battery capacity from battery voltage or charging and discharging current flowing through the batteries 1. The switching devices 23 are a charging switch 23A and a discharging switch 23B connected between the batteries 1 and an output terminal 21. The charging switch 23A passes discharge current and controls charging current. The discharging switch 23B passes charging current and controls discharging current. For example, field effect transistors (FETs) can be used as these charging and discharging switching devices 23. During charging, the charge-discharge control circuit 22 controls the charging switch 23A ON. When the batteries 1 are fully charged, the charging switch 23A is switched OFF to stop charging. During discharging, the charge-discharge control circuit 22 controls the discharging switch 23B ON. When the batteries 1 discharge to the minimum remaining capacity, the discharging switch 23B is switched OFF to stop discharging. In this manner, over-charging and over-discharging are prevented.

In the battery pack of the figure, if the micro-controller 3 determines failure of the voltage detection circuit 5, the input switches 4, or the A/D converter 8, it shuts-off current flow through the batteries 1 to protect the battery pack. The battery pack of the figure has a current shut-off device 24 connected between the batteries 1 and an output terminal 21. In this battery pack, if the micro-controller 3 determines failure of the voltage detection circuit 5, the input switches 4, or the A/D converter 8, it turns the current shut-off device 24 OFF to cut-off charging and discharging current. The current shut-off device 24 is, for example, a fuse. For a fuse current shut-off device 24 that is a resistive heating element fuse, its state of conduction can be controlled. In this battery pack, if the micro-controller 3 detects failure, the control circuit 7 controls conduction in the resistive heating element to blow the fuse and shut-off charging and discharging current. For this current shut-off device 24, if the fuse is blown to shut-off current, it will not recover to a state current flow. Therefore, if battery pack failure is detected, current is shut-off and the battery pack is put in an unusable state, enabling a higher level of safety. In addition, a current shut-off device 24 that is a fuse can serve a dual purpose as a protection device that becomes open circuited with excessive current flow.

Finally, the charging and discharging switching devices can serve a dual purpose as the current shut-off device of the battery pack. In this battery pack, if the micro-controller detects failure, the charging switch is controlled OFF to shut-off charging current and the discharging switch is controlled OFF to shut-off discharging current. In this type of battery pack that uses the charging and discharging switching devices for the dual purpose of current shut-off device, it is not necessary to provide a special current shut-off device. Even in a battery pack provided with a current shut-off device, the charging and discharging switching devices can be maintained in the OFF state to protect the batteries when failure is detected.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present application is based on Application No. 2007-321, 375 filed in Japan on Dec. 12, 2007, the content of which is incorporated herein by reference.

What is claimed is:

1. A method of determining failure of a battery pack including (i) a plurality of series connected batteries, (ii) an analog front-end that detects battery voltage, and (iii) a micro-controller connected to the analog front-end, the analog front-end including (i) input switches controlled by the micro-controller, and (ii) a voltage detection circuit that connects with the plurality of batteries via the input switches, the method comprising:

short-circuiting the input-side of the voltage detection circuit by switching, using the micro-controller, the input switches to short circuit the input-side of the voltage detection circuit; and determining input switch failure, wherein said determining input switch failure is performed after said short-circuiting the input-side of the voltage detection circuit.

2. A method for determining failure of a battery pack including (i) a plurality of series connected batteries, (ii) an analog front-end that detects battery voltage, and (iii) a micro-controller that accepts analog voltage signals from the analog front-end, the micro-controller being connected to the analog front-end, wherein the analog front-end includes a plurality of input switches controlled by the micro-controller, and a voltage detection circuit that connects with the plurality of batteries via the input switches, the method comprising:

switching, using the micro-controller, the input switches to electrically connect positive and negative sides of a battery from among the plurality of batteries to inverting and non-inverting input terminals of the difference amplifier in a reversed polarity state to input the battery voltage to the difference amplifier in the reversed polarity state;

switching, using the micro-controller, the input switches to electrically connect the positive and the negative sides of the battery from among the plurality of batteries to the inverting and non-inverting input terminals of the difference amplifier in an un-reversed polarity state to input the battery voltage to the difference amplifier in the un-reversed polarity state; and determining failure of the voltage detection circuit, wherein said determining failure of the voltage detection circuit is performed after (i) said switching the input switching to electrically connect the positive and negative sides of the battery from among the plurality of batteries to the inverting and non-inverting input terminals of the different amplifier in the reversed polarity state and (ii) said switching the input switching to electrically connect the positive and negative sides of the battery from among the plurality of batteries to the inverting and non-inverting input terminals of the different amplifier in the un-reversed polarity state.

3. The method of claim 2, wherein a standard voltage is input to one of the terminals of the difference amplifier.

4. The method of claim 1, wherein said short-circuiting the input-side of the voltage detection circuit includes detecting an input voltage of the voltage detection circuit with the input-side of the voltage detection circuit short-circuited, and wherein said determining input switch failure determines that the input switch failure has occurred when the detected input voltage of the voltage detection circuit is not a prescribed value.

5. The method of claim 2, wherein said switching the input switching to electrically connect the positive and negative sides of the battery from among the plurality of batteries to the inverting and non-inverting input terminals of the different amplifier in the reversed polarity state includes detecting an output voltage of the difference amplifier in the reversed polarity state, wherein said switching the input switching to electrically connect the positive and negative sides of the battery from among the plurality of batteries to the inverting and non-inverting input terminals of the different amplifier in the un-reversed polarity state includes detecting an output voltage of the difference amplifier in the un-reversed polarity state, and wherein said determining failure of the voltage detection circuit determines that the failure of the voltage detection circuit has occurred when the detected output voltage of the difference amplifier in the reversed polarity state and the detected output voltage of the difference amplified in the un-reversed polarity state deviate from predetermined values, respectively.

* * * * *